United States Patent
Tseng et al.

(10) Patent No.: US 6,304,119 B1
(45) Date of Patent: Oct. 16, 2001

(54) TIMING GENERATING APPARATUS WITH SELF-CALIBRATING CAPABILITY

(75) Inventors: Huan-Ming Tseng, Taipei; I-Shih Tseng, Taipei Hsien; Chau-Chin Su, Taipei; Chih-Hung Lin, Tainan Hsien; Chun-Min Yang, Kaohsiung, all of (TW)

(73) Assignee: Chroma Ate Inc., Taipei Hsien (TW)

( * ) Notice: Subject to any disclaimer, the term of this patent is extended or adjusted under 35 U.S.C. 154(b) by 0 days.

(21) Appl. No.: 09/748,926

(22) Filed: Dec. 27, 2000

(51) Int. Cl.⁷ ..................................................... H03L 7/00
(52) U.S. Cl. ................................................................ 327/161
(58) Field of Search ..................................... 327/141, 142, 327/148, 149, 150, 151, 160, 161, 157–159, 202, 199, 261, 26

(56) References Cited

U.S. PATENT DOCUMENTS

| | | |
|---|---|---|
| 5,214,680 * | 5/1993 | Gutierrez, Jr. et al. ................ 377/20 |
| 5,243,227 * | 9/1993 | Gutierrez, Jr. et al. ............. 327/161 |
| 5,710,744 * | 1/1998 | Suda ...................................... 368/120 |
| 6,247,138 * | 6/2001 | Tamura et al. ........................ 713/600 |

* cited by examiner

Primary Examiner—My-Trang Nu Ton
(74) Attorney, Agent, or Firm—Ladas & Parry

(57) ABSTRACT

A timing generating apparatus includes a master timing module adapted to receive an external reference clock and to generate a coarse timing pulse signal. A slave timing module is coupled electrically to the master timing module and receives the coarse timing pulse signal, from which a fine timing pulse signal is generated. A calibration module coupled electrically to the master timing module and the slave timing module receives the coarse timing pulse signal and the fine timing pulse signal, determines a phase difference value between the two, and generates a phase compensation signal corresponding to difference between the phase difference value and a predetermined phase difference value. The slave timing module includes a delay control unit and a voltage-controlled delay unit, which introduce a phase delay into the coarse timing pulse signal so as to generate the fine timing pulse signal.

7 Claims, 6 Drawing Sheets

TIMING GENERATING APPARATUS WITH SELF-CALIBRATING CAPABILITY

BACKGROUND OF THE INVENTION

1. Field of the Invention

The invention relates to a timing generating apparatus, more particularly to a timing generating apparatus with self-calibrating capability.

2. Description of the Related Art

A timing generator is generally used to provide a timing pulse signal to an IC automatic test equipment (ATE) such that modules of the IC ATE can operate according to the timing pulse signal. Since IC ATE needs to test various IC products, the timing generator must provide accurate timing pulses to conform with a wide range of IC products. Recently, CMOS components are used in the IC ATE. However, due to changes in temperature, CMOS components will experience timing variation such that a compensation or calibration circuit is needed.

Referring to FIG. 1, a conventional timing generating apparatus is shown to include a master timing module 10, and a plurality of slave timing modules 11, each of which is coupled electrically to the master timing module 10. The master timing module 10 receives an external reference clock, and generates a plurality of coarse timing pulse signals. Each of the slave timing modules 11 receives the coarse timing pulse signals, and is operable so as to generate a fine timing pulse signal according to a selected one of the coarse timing pulse signals. For example, the coarse timing pulse signals have different time periods, such as 1.0 ns, 2.0 ns, 3.0 ns, . . . . The slave timing modules can generate a plurality of timing pulse signals with different adjustments in time periods, such as 0.05 ns, 0.10 ns, 0.15 ns, . . . . When the conventional timing generating apparatus needs to generate a timing pulse signal with a time period of 6.12 ns, the coarse timing pulse signal with a time period of 6.0 ns is selected by one of the slave timing modules 11 that generates a phase delay of 0.12 ns.

FIG. 2 illustrates an embodiment of the conventional timing generating apparatus. The master timing module 10 is a phase locked ring oscillator that is a closed-loop system. The slave timing module 11 is composed of a programmable delay unit that is an open-loop system and that is unable to maintain the accuracy of the fine timing pulse signal.

FIG. 3 illustrates another embodiment of the conventional timing generating apparatus. In FIG. 3, unlike the embodiment of FIG. 2, the slave timing module 11' is implemented as a phase locked delay line for generating the fine timing pulse signal from the coarse timing pulse signal via a phase selection multiplexer 111. While the fine timing pulse signal can be obtained from the slave timing module 11', it is noted that the phase selection multiplexer 111 and drivers are outside of a phase locked loop of the phase locked delay line. Therefore, the accuracy of the fine timing pulse signal is affected by the high temperature coefficient of solid state devices such that a temperature compensation mechanism is needed to maintain the accuracy of the fine timing pulse signal at different temperatures.

SUMMARY OF THE INVENTION

Therefore, the object of the present invention is to provide a timing generating apparatus with self-calibrating capability that has a relatively high accuracy and that can be produced at a relatively low cost.

According to the present invention, a timing generating apparatus includes a master timing module, a slave timing module and a calibration module.

The master timing module is adapted to receive an external reference clock and to generate a coarse timing pulse signal therefrom.

The slave timing module is coupled electrically to the master timing module so as to receive the coarse timing pulse signal therefrom, and is operable so as to generate a fine timing pulse signal from the coarse timing pulse signal.

The calibration module is coupled electrically to the master timing module and the slave timing module. The calibration module receives the coarse timing pulse signal and the fine timing pulse signal, determines a phase difference value between the coarse timing pulse signal and the fine timing pulse signal, and generates a phase compensation signal corresponding to difference between the phase difference value and a predetermined phase difference value.

The slave timing module includes a delay control unit that receives the phase compensation signal from the calibration module, and that generates a delay voltage signal corresponding to the phase compensation signal, and a voltage-controlled delay unit that receives the coarse timing pulse signal and the delay voltage signal, and that introduces a phase delay corresponding to the delay voltage signal into the coarse timing pulse signal so as to generate the fine timing pulse signal.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
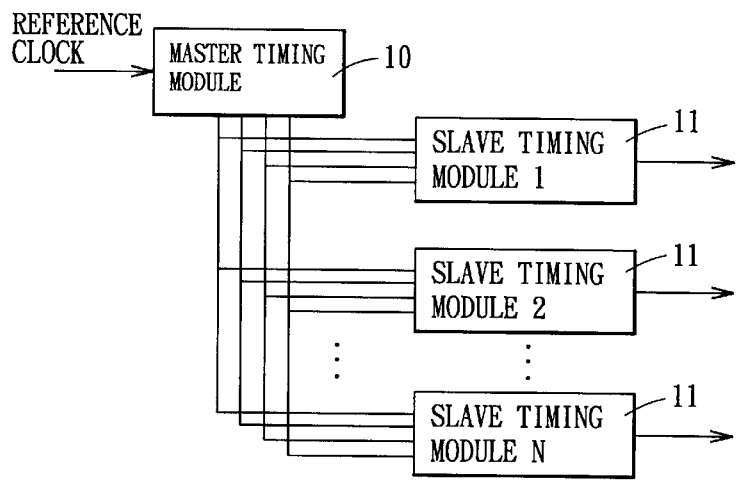
FIG. 1 is a schematic circuit block diagram illustrating a conventional timing generating apparatus.
Figure 2:
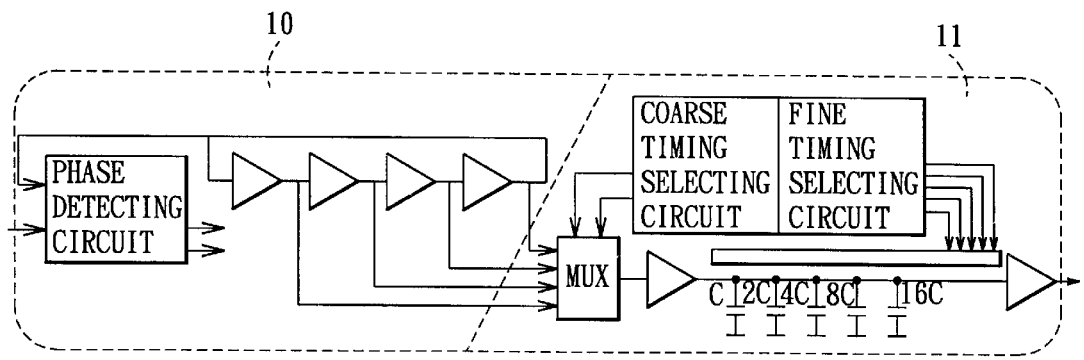
FIG. 2 is a schematic electrical circuit diagram illustrating an embodiment of the conventional timing generating apparatus.
Figure 3:
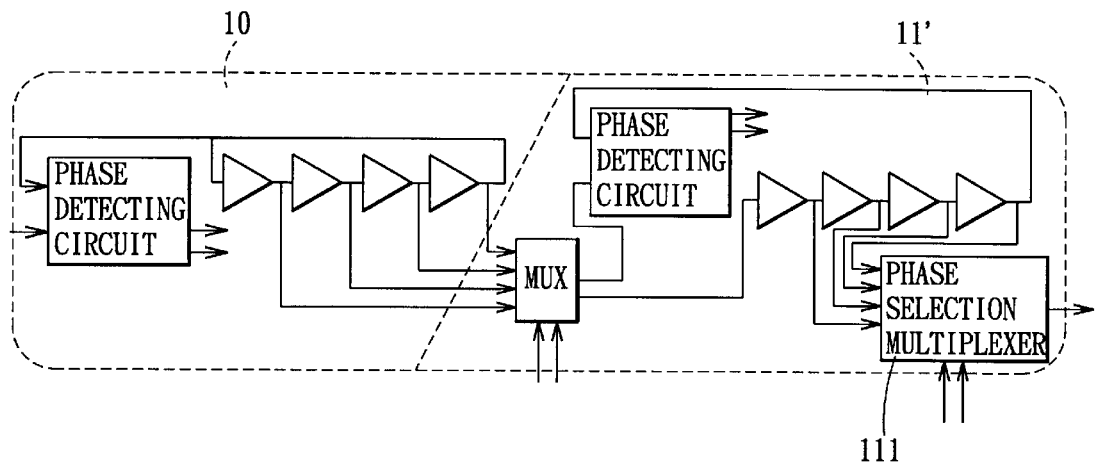
FIG. 3 is a schematic electrical circuit diagram illustrating another embodiment of the conventional timing generating apparatus.
Figure 4:
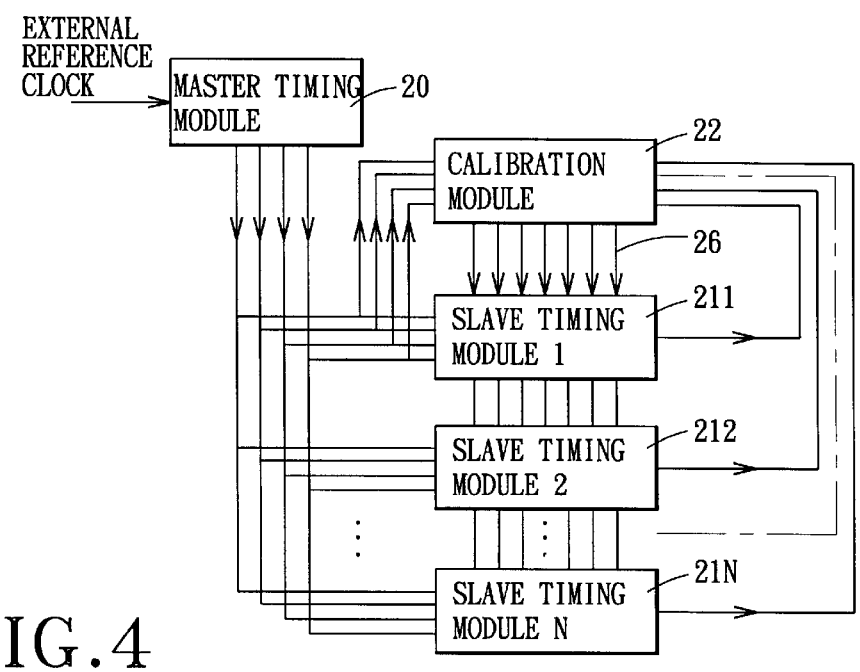
FIG. 4 is a schematic circuit block diagram of the preferred embodiment of a timing generating apparatus according to this invention.

Referring to FIG. 4, according to the preferred embodiment of this invention, a timing generating apparatus is shown to include a master timing module 20, a plurality of slave timing modules 211, 212, . . . , 21N, and a calibration module 22.

The master timing module 20 is adapted to receive an external reference clock and to generate a plurality of coarse timing pulse signals therefrom in a conventional manner.

Each of the slave timing modules 211, 212, . . . , 21N is coupled electrically to the master timing module 20 so as to receive the coarse timing pulse signals therefrom, and is operable so as to generate a fine timing pulse signal from a selected one of the coarse timing pulse signals.

The calibration module 22 is coupled electrically to the master timing module 20 and each of the slave timing modules 211, 212, . . . , 21N. The calibration module 22 receives the coarse timing pulse signals and the fine timing pulse signals, determines a phase difference value between a selected one of the coarse timing pulse signals and a corresponding one of the fine timing pulse signals, and generates a phase compensation signal corresponding to difference between the phase difference value and a predetermined phase difference value.

Figure 5:
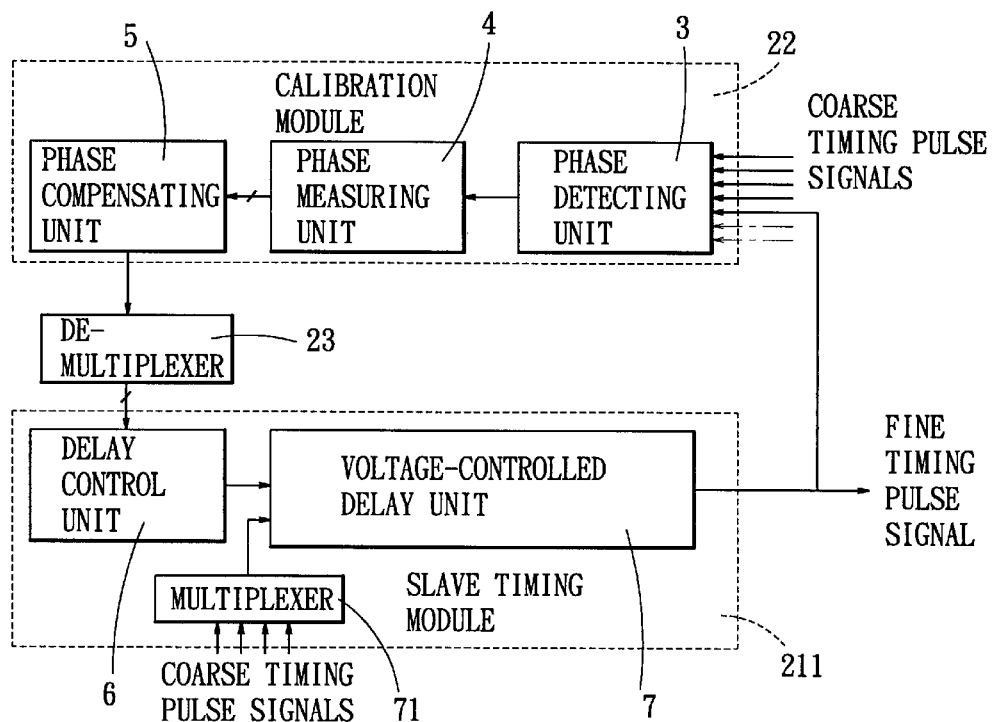
FIG. 5 is a schematic circuit block diagram of a slave timing module and a calibration module of the preferred embodiment.

Referring to FIG. 5, the slave timing module 211 includes a delay control unit 6, and a voltage-controlled delay unit 7 coupled electrically to the delay control unit 6 and to the master timing module 20 via a multiplexer 71. The calibration module 22 includes a phase detecting unit 3 coupled electrically to the voltage-controlled delay unit 7 of each of the slave timing modules 211, 212, . . . , 21N and the master timing module 20, a phase measuring unit 4 coupled electrically to the phase detecting unit 3, and a phase compensating unit 5 coupled electrically to the phase measuring unit 4 and the delay control unit 6 of the slave timing module 211 via a de-multiplexer 23.

Figure 6:
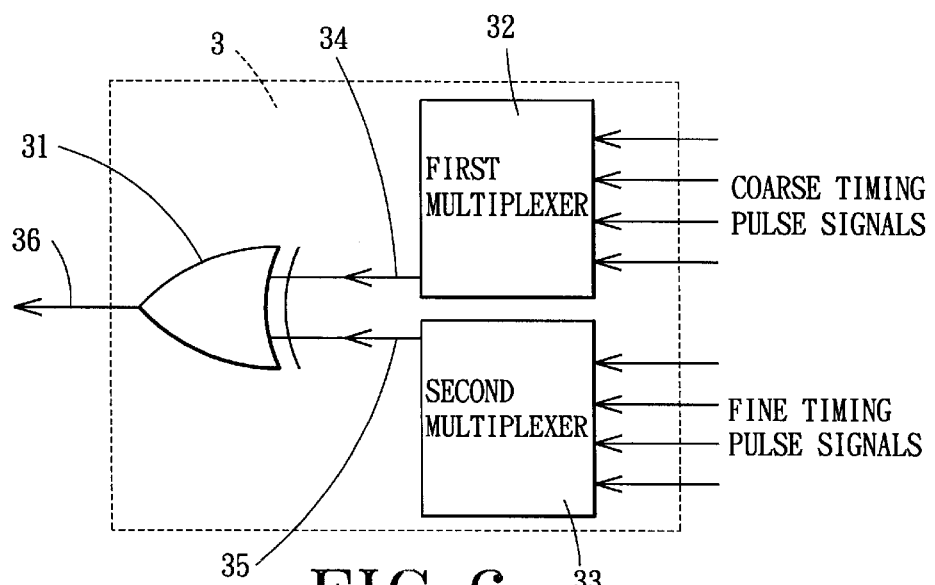
FIG. 6 is a schematic electrical circuit diagram illustrating a phase detecting unit of the calibration module.
Figure 7A:
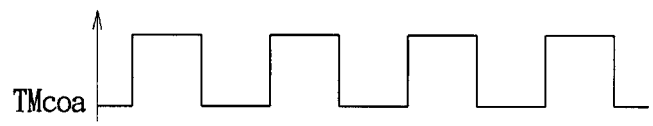
FIGS. 7A to 7C are timing diagrams illustrating a coarse timing pulse signal, a fine timing pulse signal, and a phase difference pulse, respectively.
Figure 7B:
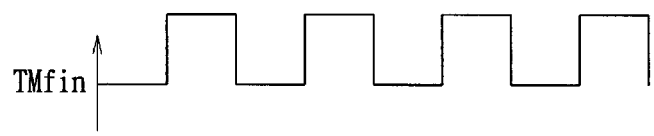
Figure 7C:
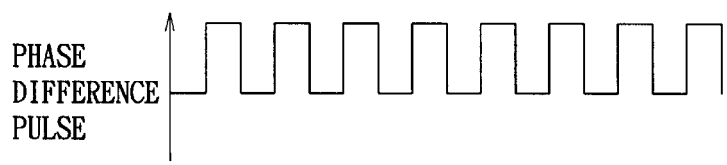

In this embodiment, as shown in FIG. 6, the phase detecting unit 3 includes a first multiplexer 32 receiving the coarse timing pulse signals from the master timing module 20 and operable so as to output a selected one ($TM_{coa}$) of the coarse timing pulse signals (see FIG. 7A), a second multiplexer 33 receiving fine timing pulse signals from the slave timing modules 211, 212, . . . , 21N and operable so as to output the fine timing pulse signal ($TM_{fin}$) from the slave timing module 211 (see FIG. 7B), and an exclusive OR gate 31 having a first input 34 coupled electrically to the first multiplexer 32 for receiving the selected one ($TM_{coa}$) of the coarse timing pulse signals, and a second input end 35 coupled electrically to the second multiplexer 33 for receiving the fine timing pulse signal ($TM_{fin}$). The gate 31 generates a phase difference pulse at a phase difference pulse output 36 thereof when the selected one ($TM_{coa}$) of the coarse timing pulse signals and the fine timing pulse signal ($TM_{fin}$) are at different logic states, as shown in FIG. 7C.

Figure 8:
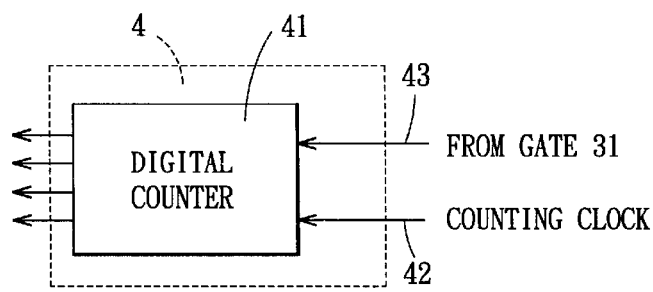
FIG. 8 is a schematic electrical circuit diagram illustrating a phase measuring unit of the calibration module.
Figure 9A:
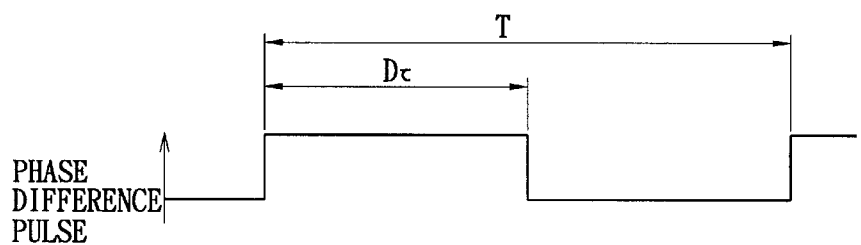
FIGS. 9A to 9C are timing diagrams illustrating the phase difference pulse, a first counting clock, and a second counting clock, respectively.
Figure 9B:
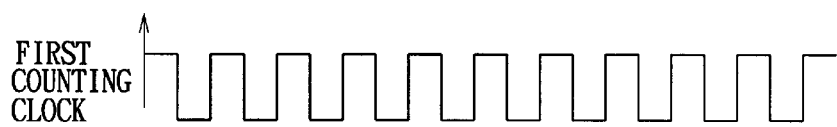
Figure 9C:
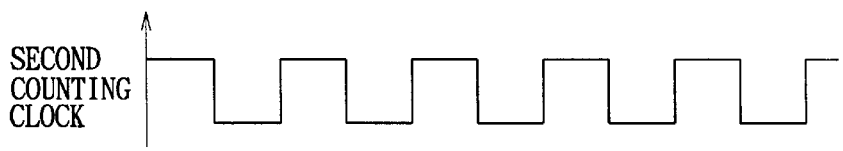

In this embodiment, as shown in FIG. 8, the phase measuring unit 4 includes a digital counter 41 having a phase difference pulse input 43 coupled electrically to the phase difference pulse output 36 of the exclusive OR gate 31 for receiving the phase difference pulse, and an input 42 for receiving a counting clock with a frequency (F). In the duty cycle (D$\tau$) of a period (T) of the phase difference pulse, the digital counter 41 determines and outputs a phase difference value between the selected one ($TM_{coa}$) of the coarse timing pulse signals and the fine timing pulse signal ($TM_{fin}$). The phase difference value is equal to D$\tau$*F. FIG. 9A shows a phase difference pulse from the gate 31. FIGS. 9B and 9C show first and second counting clocks, wherein the first counting clock has a larger frequency larger than the second counting clock. It is noted that a more accurate phase measurement can be obtained using the first counting clock instead of the second counting clock.

Figure 10:
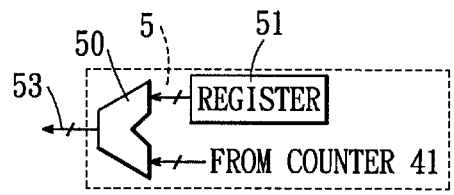
FIG. 10 is a schematic electrical circuit diagram illustrating a phase compensating unit of the calibration module.

In this embodiment, as shown in FIG. 10, the phase compensating unit 5 has a register 51 for storing the predetermined phase difference value, and a subtracter 50 coupled electrically to the register 51 and the digital counter 41. The subtracter 50 receives the phase difference value from the digital counter 41 and the predetermined phase difference value from the register 51, and generates the phase compensation signal in digital form at an output 53 thereof.

Figure 11:
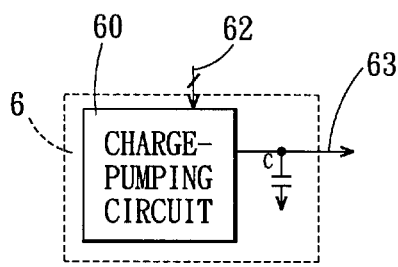
FIG. 11 is a schematic electrical circuit diagram illustrating a delay control unit of the slave timing module.

In this embodiment, as shown in FIG. 11, the delay control unit 6 includes a charge-pump circuit 6 and a capacitor (C). The charge-pump circuit 6 has an input 62 that receives the phase compensation signal from the subtracter 50 of the phase compensating unit 5 via the de-multiplexer 23, and an output 63. The capacitor (C) is connected across the output 63 of the charge-pump circuit 60. The delay control unit 6 generates an analog delay voltage signal, which is obtained across the capacitor (C), corresponding to the digital phase compensation signal.

Figure 12:
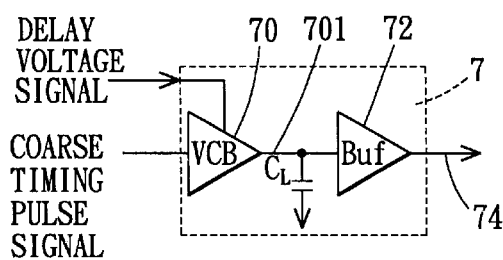
FIG. 12 is a schematic electrical circuit diagram illustrating a voltage-controlled delay unit of the slave timing module.

In this embodiment, as shown in FIG. 12, the voltage-controlled delay unit 7 includes a voltage-controlled variable gain buffer (VCB) 70 that is coupled electrically to the output 63 of the charge-pump circuit 60 for receiving the delay voltage signal, that receives the selected one of the coarse timing pulse signals from the master timing module 20 via the multiplexer 71, and that has an output 701, a capacitor ($C_L$) connected across the output 701 of the voltage-controlled variable gain buffer 70, and a fixed gain output buffer (BUF) 72 that is coupled electrically to the output 701 of the voltage-controlled variable gain buffer 70 and that has an output 74. The voltage-controlled delay unit 7 introduces a phase delay corresponding to the delay voltage signal into the selected one ($TM_{coa}$) of the coarse timing pulse signals so as to generate the fine timing pulse signal that is obtained from the output 74.

The following are some of the advantages of the present invention:

1. Since the timing generating apparatus of this invention is a closed loop system, and since the phase of the fine timing pulse signal is detected from the output 74 of the slave timing module, the accuracy of the fine timing pulse signal can be ensured.

2. Since the calibration module 22 of this invention utilizes direct measurement of the phase difference between the coarse timing pulse signal ($TM_{coa}$) and the fine timing pulse signal ($TM_{fin}$), which involves a self-calibration, an extra calibration process is not needed.

3. Due to the use of the digital counter 42, the transformation from analog signals to digital signals is not needed, thereby resulting in relatively high accuracy and relatively low costs.

4. Since the phase difference value is a statistical value, the calibration module 22 can be flexibly adjusted so as to satisfy the system requirement of high accuracy or high-speed response.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

We claim:

1. A timing generating apparatus comprising:
   a master timing module adapted to receive an external reference clock and to generate a coarse timing pulse signal therefrom;

a slave timing module coupled electrically to said master timing module so as to receive the coarse timing pulse signal therefrom, and operable so as to generate a fine timing pulse signal from the coarse timing pulse signal; and a calibration module coupled electrically to said master timing module and said slave timing module, said calibration module receiving the coarse timing pulse signal and the fine timing pulse signal, determining a phase difference value between the coarse timing pulse signal and the fine timing pulse signal, and generating a phase compensation signal corresponding to difference between the phase difference value and a predetermined phase difference value;

said slave timing module including a delay control unit that receives the phase compensation signal from said calibration module, and that generates a delay voltage signal corresponding to the phase compensation signal, and a voltage-controlled delay unit that receives the coarse timing pulse signal and the delay voltage signal, and that introduces a phase delay corresponding to the delay voltage signal into the coarse timing pulse signal so as to generate the fine timing pulse signal.

2. The timing generating apparatus of claim 1, wherein said calibration module includes:

a phase detecting unit for generating a phase difference pulse when the coarse timing pulse signal and the fine timing pulse signal are at different logic states; and a phase measuring unit coupled electrically to said phase detecting unit for generating the phase difference value that corresponds to width of the phase difference pulse.

3. The timing generating apparatus of claim 2, wherein said phase detecting unit includes an exclusive OR gate.

4. The timing generating apparatus of claim 2, wherein said phase measuring unit includes a digital counter.

5. The timing generating apparatus of claim 4, wherein said calibration module further includes a phase compensating unit having a register for storing the predetermined phase difference value, and a subtracter coupled electrically to said register and said phase measuring unit, said subtracter receiving the phase difference value from said phase measuring unit and the predetermined phase difference value from said register, and generating the phase compensation signal.

6. The timing generating apparatus of claim 1, wherein said delay control unit includes:

a charge-pumping circuit having an input that receives the phase compensation signal from said phase compensating unit, and an output; and a capacitor connected across said output of said charge-pumping circuit, the delay voltage signal being obtained across said capacitor.

7. The timing generating apparatus of claim 1, wherein said voltage-controlled delay unit includes:

a voltage-controlled variable gain buffer that receives the delay voltage signal and the coarse timing pulse signal, and that has an output;

a capacitor connected across said output of said voltage-controlled variable gain buffer; and a fixed gain output buffer that is coupled electrically to said output of said voltage-controlled variable gain buffer, and that has an output from which the fine timing pulse signal is obtained.

* * * * *